(12) United States Patent
Hahn et al.

(10) Patent No.: US 7,938,131 B2
(45) Date of Patent: May 10, 2011

(54) APPARATUS FOR EJECTING FLUID ONTO A SUBSTRATE AND SYSTEM AND METHOD INCORPORATING THE SAME

(75) Inventors: Christopher Hahn, Huntington Beach, CA (US); Hanjoo Lee, Paju (KR)

(73) Assignee: Akrion Systems, LLC

( * ) Notice: Subject to any disclaimer, the term of this patent is extended or adjusted under 35 U.S.C. 154(b) by 183 days.

(21) Appl. No.: 11/781,835

(22) Filed: Jul. 23, 2007

(65) Prior Publication Data

US 2008/0178911 A1 Jul. 31, 2008

Related U.S. Application Data

(60) Provisional application No. 60/832,631, filed on Jul. 21, 2006.

(51) Int. Cl.
*B08B 3/04* (2006.01)
(52) U.S. Cl. ........ 134/163; 118/316; 118/315; 118/319; 118/320; 118/612; 118/52
(58) Field of Classification Search .................. 134/163; 118/316, 315, 319, 320, 612, 52
See application file for complete search history.

(56) References Cited

U.S. PATENT DOCUMENTS

| | | |
|---|---|---|
| 2,498,737 A | 2/1950 | Holden |
| 2,967,120 A | 1/1961 | Chaney |
| 3,005,417 A | 10/1961 | Swaney |
| 3,058,014 A | 10/1962 | Camp |
| 3,163,149 A | 12/1964 | Ivey |
| 3,208,157 A | 9/1965 | Stark |
| 3,301,535 A | 1/1967 | Brown |
| 3,329,408 A | 7/1967 | Branson |
| 3,371,233 A | 2/1968 | Cook |
| 3,396,286 A | 8/1968 | Anderson at al |
| 3,405,916 A | 10/1968 | Carmichael |
| 3,415,548 A | 12/1968 | Goodman et al. |
| 3,437,543 A | 4/1969 | Winings |
| 3,445,092 A | 5/1969 | Fierle et al. |
| 3,628,071 A | 12/1971 | Harris et al. |
| 3,645,581 A | 2/1972 | Lasch, Jr. et al. |
| 3,698,408 A | 10/1972 | Jacke |
| 3,720,402 A | 3/1973 | Cummins et al. |
| 3,851,861 A | 12/1974 | Cummins et al. |
| 3,873,071 A | 3/1975 | Tatebe |
| 3,945,618 A | 3/1976 | Shoh |
| 3,953,265 A | 4/1976 | Hood |
| 4,016,436 A | 4/1977 | Shoh |
| 4,062,463 A | 12/1977 | Hillman et al. |
| 4,099,417 A | 7/1978 | Shwartzman |
| 4,118,649 A | 10/1978 | Shwartzman et al. |
| 4,161,356 A | 7/1979 | Giffin et al. |
| 4,190,015 A | 2/1980 | Hillman |
| 4,416,213 A | 11/1983 | Sakiya |
| 4,544,446 A | 10/1985 | Cady |
| 4,564,280 A | 1/1986 | Fukuda |
| 4,602,184 A | 7/1986 | Meltzler |
| 4,635,666 A | 1/1987 | Daley et al. |
| 4,788,994 A | 12/1988 | Shinbara |

(Continued)

*Primary Examiner* — Michael Barr
*Assistant Examiner* — Samuel A Waldbaum
(74) *Attorney, Agent, or Firm* — The Belles Group, P.C.

(57) ABSTRACT

A fluid dispenser for use in the processing of substrates. The dispenser has a dome shaped body with a convex upper surface and has a number of conduits designed to supply fluid to the surface of a substrate at predetermined points.

3 Claims, 13 Drawing Sheets

U.S. PATENT DOCUMENTS

| | | | | |
|---|---|---|---|---|
| 4,806,171 | A | 2/1989 | Whitlock et al. | |
| 4,854,337 | A | 8/1989 | Bunkenburg et al. | |
| 4,871,417 | A | 10/1989 | Nishizawa et al. | |
| 5,032,217 | A | 7/1991 | Tanaka | |
| 5,038,808 | A | 8/1991 | Hammond et al. | |
| 5,148,823 | A | 9/1992 | Bran | |
| 5,156,174 | A | 10/1992 | Thompson et al. | |
| 5,213,103 | A | 5/1993 | Martin et al. | |
| 5,241,976 | A | 9/1993 | Ikawa | |
| 5,254,205 | A | 10/1993 | Tsutsumi et al. | |
| 5,268,036 | A | 12/1993 | Neubauer et al. | |
| 5,270,079 | A | 12/1993 | Bok | |
| 5,286,301 | A | 2/1994 | Albrecht | |
| 5,286,657 | A | 2/1994 | Bran | |
| 5,328,556 | A | 7/1994 | Matlow | |
| 5,333,628 | A | 8/1994 | Ogata et al. | |
| 5,337,446 | A | 8/1994 | Smith et al. | |
| 5,339,842 | A | 8/1994 | Bok | |
| 5,355,048 | A | 10/1994 | Estes | |
| 5,361,449 | A | 11/1994 | Akimoto | |
| 5,375,291 | A | 12/1994 | Tateyama et al. | |
| 5,494,526 | A | 2/1996 | Paranjpe | |
| 5,518,542 | A | 5/1996 | Matsukawa et al. | |
| 5,540,245 | A | 7/1996 | Munakata et al. | |
| 5,545,942 | A | 8/1996 | Jaster et al. | |
| 5,601,655 | A | 2/1997 | Bok et al. | |
| 5,629,906 | A | 5/1997 | Sudal et al. | |
| 5,656,097 | A | 8/1997 | Olesen et al. | |
| 5,672,212 | A | 9/1997 | Manos | |
| 5,779,796 | A | 7/1998 | Tomoeda et al. | |
| 5,906,687 | A | 5/1999 | Masui et al. | |
| 5,975,098 | A | 11/1999 | Yoshitani et al. | |
| 5,979,475 | A | 11/1999 | Satoh et al. | |
| 5,980,647 | A | 11/1999 | Buker et al. | |
| 5,988,189 | A | 11/1999 | Mohindra et al. | |
| 6,021,785 | A | 2/2000 | Grutzediek et al. | |
| 6,039,059 | A * | 3/2000 | Bran | 134/105 |
| 6,143,087 | A | 11/2000 | Walter | |
| 6,239,038 | B1 | 5/2001 | Wen | |
| 6,274,059 | B1 | 8/2001 | Krusell et al. | |
| 6,283,835 | B1 | 9/2001 | Harada et al. | |
| 6,348,101 | B1 | 2/2002 | Walter | |
| 6,378,534 | B1 | 4/2002 | Olesen et al. | |
| 6,391,394 | B1 | 5/2002 | Shirasuna et al. | |
| 6,433,460 | B1 | 8/2002 | Puskas | |
| 6,539,956 | B1 | 4/2003 | Wolke et al. | |
| 6,599,571 | B2 | 7/2003 | Davis | |
| 6,681,782 | B2 | 1/2004 | Bran | |
| 6,684,891 | B2 | 2/2004 | Bran | |
| 6,693,764 | B1 | 2/2004 | Doan | |
| 6,743,723 | B2 | 6/2004 | Fukumoto | |
| 6,830,619 | B2 * | 12/2004 | Shirley | 118/73 |
| 6,914,364 | B2 | 7/2005 | Puskas | |
| 6,946,773 | B2 | 9/2005 | Puskas | |
| 2002/0179120 | A1 * | 12/2002 | Ono et al. | 134/26 |
| 2004/0206373 | A1 * | 10/2004 | Donoso et al. | 134/18 |

* cited by examiner

APPARATUS FOR EJECTING FLUID ONTO A SUBSTRATE AND SYSTEM AND METHOD INCORPORATING THE SAME

CROSS-REFERENCE TO RELATED APPLICATIONS

The present application claims the benefit of U.S. Provisional Application Ser. No. 60/832,631, filed Jul. 21, 2006, and Taiwanese Application Serial No., not yet known, filed on Jul. 20, 2007, the entireties of which are hereby incorporated by reference.

FIELD OF THE INVENTION

The present invention relates generally to the field of processing substrates, such as semiconductor wafers, and specifically to fluid dispensers that apply fluids to the surface of substrates during processing.

BACKGROUND OF THE INVENTION

In the field of semiconductor manufacturing, it has been recognized since the beginning of the industry that maintaining the semiconductor wafers free of contaminants during the manufacturing process is a critical requirement to producing quality profitable wafers. As the size of the devices continue to become smaller, the number of semiconductor devices present on a single wafer continues to exponentially grow. As a result of the devices becoming more and more miniaturized, cleanliness requirements have also become increasingly important and stringent. When dealing with reduced size devices, the ratio of the size of a contaminant compared to the size of a device is greater, resulting in an increased likelihood that a contaminated device will not function properly. Thus, increasingly stringent cleanliness and PRE requirements are needed. As a result, improved semiconductor wafer processing techniques that reduce the amount and size of the contaminants present during wafer production are highly desired.

An example of a single-wafer cleaning system that utilizes megasonic energy is disclosed in U.S. Pat. No. 6,039,059 ("Bran"), issued Mar. 21, 2000. An example of a single-wafer cleaner and dryer is disclosed in U.S. Pat. No. 7,100,304 ("Lauerhaas et al."), issued Sep. 5, 2006. The entireties of Bran and Lauerhaas et al. are hereby incorporated by reference.

In single-wafer processing systems, such as the ones mentioned above, a semiconductor wafer is supported and rotated in a horizontal orientation. A desired processing chemical is then applied to one or both sides/surfaces of the wafer. Nozzles/dispensers are typically placed underneath the wafer and dispense fluid in an upward direction so as to apply the fluid on the bottom surface of the wafer. It is important that the level of contaminants and/or residues left on the surface of the wafer be minimized to the extent possible at all times.

While the dispensers serve the vital function of applying fluids to the surface of the wafer, they also present a problem in that fluid and contaminants will collect on the top surface of the dispenser and get re-deposited back on the wafer. Thereby re-contaminating the wafer and causing semiconductor device failure problems. Additionally, because the wafer spins during the application of fluid, turbulence is created between the bottom surface of the wafer and the top surface of the dispenser that may damage the wafer or may cause more contaminants to remain on the surface of the wafer.

Therefore, there is a need to provide an improved apparatus, system and method for processing substrates that prevents and/or minimizes the deposit of contaminants on the wafer.

SUMMARY OF THE INVENTION

An object of the present invention is to provide a system, apparatus and method that minimizes the deposit of contaminants on the surface of a substrate.

A further object of the present invention is to provide an apparatus that allows for multiple fluids to be discharged through the same apparatus without cleaning out the apparatus.

A still further object of the present invention is to provide a fluid dispenser that minimizes the turbulence between a rotating substrate and the dispenser.

A yet further object of the present invention is to provide an apparatus for dispensing fluid onto a surface of a substrate at predetermined points on the substrate.

Another object of the present invention is to provide a fluid dispenser that simplifies the hardware required in the processing of a substrate.

A still further object of the present invention is to provide a fluid dispenser that improves the cleaning of the backside of substrates.

These and other objects are met by the present invention which in one aspect can be a system for processing substrates comprising: a rotatable support for supporting and rotating a substrate about a rotational center-point; a fluid dispensing apparatus comprising a body with a substantially dome-shaped outer surface and a plurality of conduits terminating as holes in the outer surface of the body, wherein the conduits are adapted to eject fluid out of the holes; and wherein the fluid dispensing apparatus is positioned so that fluid dispensed out of the holes contacts a surface of a substrate on the rotatable support.

In another aspect the invention can be a system for processing substrates comprising: a rotatable support for supporting and rotating a substrate about a rotational center-point; a fluid dispensing apparatus comprising a body, a first header and a second header; the first header having an inlet adapted to introduce a first fluid into the first header; the second header having an inlet adapted to introduce a second fluid into the second header; a first array of conduits extending from the first header and terminating as holes in an outer surface of the body, the first array of conduits adapted to eject the first fluid from the first header and onto a substrate located on the rotatable support; and a second array of conduits extending from the second header and terminating as holes in the outer surface of the body, the second array of conduits adapted to eject the second fluid from the second header and onto a substrate located on the rotatable support.

In another aspect the invention can be an apparatus for applying a fluid to a surface of a substrate comprising: a body having a first header and a second header; a first inlet for introducing a first fluid into the first header; a second inlet for introducing a second fluid into the second header; a first array of conduits extending from the first header and terminating as holes in an outer surface of the body, the first array of conduits adapted to eject the first fluid; and a second array of conduits extending from the second header and terminating as holes in the outer surface of the body, the second array of conduits adapted to eject the second fluid.

In another aspect the invention can be a method for processing a substrate comprising: supporting a substrate in a horizontal orientation; rotating the substrate; providing a fluid dispensing apparatus adjacent a surface of the substrate, the fluid dispensing apparatus comprising a body with a substantially dome-shaped outer surface and a plurality of conduits terminating as holes in the outer surface of the body, wherein the conduits are adapted to dispense fluid out of the holes; and applying fluid to the surface of the substrate via the fluid dispensing apparatus.

In another aspect the invention can be a method of processing a substrate comprising: supporting a substrate in a horizontal orientation; rotating the substrate; providing a fluid dispensing apparatus adjacent a surface of the substrate, the fluid dispensing apparatus comprising a body having a first header and a second header, a first inlet for introducing a first fluid into the first header, a second inlet for introducing a second fluid into the second header, a first array of conduits extending from the first header and terminating as holes in an outer surface of the body, the first array of conduits adapted to eject the first fluid, a second array of conduits extending from the second header and terminating as holes in the outer surface of the body, the second array of conduits adapted to eject the second fluid; applying a first fluid to the surface of the substrate via the first array of conduits of fluid dispensing apparatus; and applying a second fluid to the surface of the substrate via the second array of conduits of the fluid dispensing apparatus.

DETAILED DESCRIPTION OF THE DRAWINGS

Figure 1:
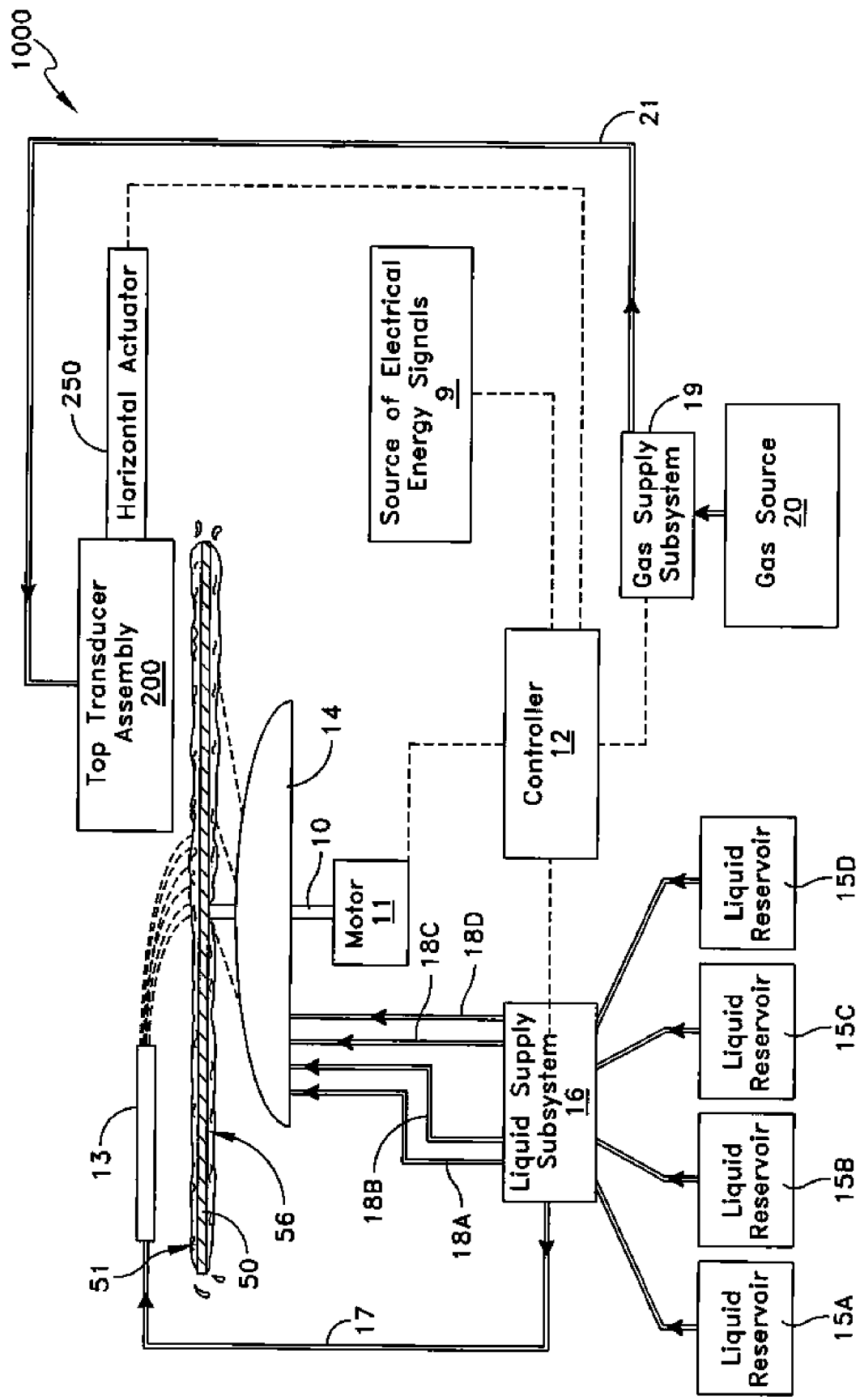
FIG. 1 is a schematic of a cleaning system according to one embodiment of the present invention.

Referring first to FIG. 1, a schematic of an acoustic energy cleaning system 1000 (hereinafter referred to as "cleaning system 1000") is illustrated according to one embodiment of the present invention. For ease of discussion, the inventive system and methods of the drawings will be discussed in relation to the cleaning of semiconductor wafers. However, the invention is not so limited and can be utilized for any desired wet processing of any flat article.

The cleaning system 1000 generally comprises a top transducer assembly 200, a rotatable support 10 for supporting a semiconductor wafer 50 in a substantially horizontal orientation, a top dispenser 13 and a bottom dispenser 14. Preferably, the semiconductor wafer 50 is supported so its top surface 51 is the device side of the wafer 50 while the bottom surface 56 is the non-device side. Of course, the wafer can be supported so that its top surface 51 is the non-device side while the bottom surface 56 is the device side, if desired.

The rotatable support 10 is designed to contact and engage only a perimeter of the substrate 50 in performing its support function. However, the exact details of the structure of the rotatable support 10 are not limiting of the present invention and a wide variety of other support structures can be used, such as chucks, support plates, etc. Additionally, while it is preferred that the support structure support and rotate the semiconductor wafer in a substantially horizontal orientation, in other embodiments of the invention, the system may be configured so that the semiconductor wafer is supported in other orientations, such as vertical or at an angle. In such embodiments, the remaining components of the cleaning system 1000, including the transducer assembly 200, can be correspondingly repositioned in the system so as to be capable of performing the desired functions and/or the necessary relative positioning with respect to other components of the system as discussed below.

The rotary support 10 is operably coupled to a motor 11 to facilitate rotation of the wafer 50 within the horizontal plane of support. The motor 11 is preferably a variable speed motor that can rotate the support 10 at any desired rotational speed $\omega$. The motor 11 is electrically and operably coupled to the controller 12. The controller 12 controls the operation of the motor 11, ensuring that the desired rotational speed $\omega$ and desired duration of rotation are achieved.

The top dispenser 13 is positioned and oriented so that when a liquid is flowed therethrough, the liquid is applied to the top surface 51 of the substrate 50. When the substrate 50 is rotating, this liquid forms a layer or film of the liquid across the entirety of the top surface 51 of the substrate 50. The bottom dispenser 14 is positioned and oriented so that when a liquid is flowed therethrough, the liquid is applied to the bottom surface 56 of the substrate 50. When the substrate 50 is rotating, this liquid forms a layer or film of the liquid across the entirety of the bottom surface 56 of the substrate 50.

Both the top dispenser 13 and the bottom dispenser 14 are operably and fluidly coupled to a liquid supply subsystem 16 via liquid supply lines 17, 18A-D. The liquid supply subsystem 16 is in turn fluidly connected to the liquid reservoirs 15A-D. The liquid supply subsystem 16 controls the supply of liquid to both the top dispenser 13 and the bottom dispenser 14. The bottom dispenser 14 is operably and fluidly connected all four liquid reservoirs 15A-D. As will be discussed in further detail below, this allows for the application of four different liquids to various points on the bottom surface 56 of the wafer 50 through the bottom dispenser 14.

The liquid supply subsystem 16, which is schematically illustrated as a box for purposes of simplicity, comprises the desired arrangement of all of the necessary pumps, valves, ducts, connectors and sensors for controlling the flow and transmission of the liquid throughout the cleaning system 1000. The direction of the liquid flow is represented by the arrows on the supply lines 17, 18A-D. Those skilled in the art will recognize that the existence, placement and functioning of the various components of the liquid supply subsystem 16 will vary depending upon the needs of the cleaning system 1000 and the processes desired to be carried out thereon, and can be adjusted accordingly. The components of the liquid supply subsystem 16 are operably connected to and controlled by the controller 12.

The liquid reservoirs 15A-D hold the desired liquid to be supplied to the wafer 50 for the processing that is to be carried out. For cleaning system 1000, the liquid reservoirs 15A-D will each hold a cleaning liquid, such as for example deionized water ("DIW"), standard clean 1 ("SC1"), standard clean 2 ("SC2"), ozonated deionized water ("DIO$_3$"), dilute or ultra-dilute chemicals, and/or combinations thereof. As used herein, the terms "liquid" and "fluid" include at least liquids, liquid-liquid mixtures, liquid-gas mixtures, and other supercritical and/or dense fluids.

The cleaning system 1000 further comprises a gas supply subsystem 19 that is operably and fluidly coupled to a gas source 20. The gas supply subsystem 19 is operably and fluidly connected to the top transducer assembly 200 via the gas supply line 21. The gas supply subsystem 19, which is schematically illustrated as a box for purposes of simplicity, comprises the desired arrangement of all of the necessary pumps, valves, ducts, connectors and sensors for controlling the flow and transmission of the gas throughout the cleaning system 1000. The direction of the gas flow is represented by the arrows on the supply line 21. Those skilled in the art will recognize that the, existence, placement and functioning of the various components of the gas supply subsystem 19 will vary depending upon the needs of the cleaning system 1000 and the processes desired to be carried out thereon, and can be adjusted accordingly. The components of the gas supply subsystem 19 are operably connected to and controlled by the controller 12. Thus, the transmission of gas from the gas supply subsystem 19 is based upon signals received from the controller 12.

The gas is supplied to the top transducer assembly 200 to provide cooling and/or purging to the transducer in the assembly 200 that converts the electrical energy into the acoustic energy. The gas source 15 preferably holds an inert gas, such as nitrogen, helium, carbon dioxide, etc. However, the invention is not limited to the use of any specific gas. Furthermore, as with the liquids, it is possible to have multiple gas sources. For example, in some embodiments of the invention, the top transducer assembly 200 can be operably and fluidly coupled to different gas reservoirs. This would allow the application of different gases as desired.

The cleaning system 1000 further comprises a horizontal actuator 250 that is operably coupled to the top transducer assembly 200. The actuator 250 is operably coupled to and controlled by the controller 12. The actuator 250 can be a pneumatic actuator, drive-assembly actuator, or any other style desired to effectuate the necessary movement. The horizontal actuator 250 can horizontally translate the top transducer assembly 200 between a retracted position and a processing position. When in the retracted position, the top transducer assembly 200 is withdrawn sufficiently away from the rotatable support 10 so that the wafer 50 can be loaded and unloaded without obstruction onto and from the support 10. When in the processing position, at least a portion of the top transducer assembly 200 is spaced from but sufficiently close to the top surface 51 of the wafer 50 so that when liquid is supplied to the top surface 51 of the wafer 50, a meniscus of liquid is formed between the top surface 51 of the wafer 50 and that portion of the top transducer assembly 200. In FIG. 1, the top transducer assembly 200 is in the processing position. While the actuator 200 is exemplified in system 1000 as being horizontal, in other embodiments of the invention, different styles of actuator can be used, for example the actuator 200 can be a horizontal, vertical, angled translation actuator or a pivotable actuator.

The cleaning system 1000 also comprises an electrical energy signal source 9 that is operably coupled to the top transducer assembly 200. The electrical energy signal source 9 creates the electrical signal that is transmitted to the transducer in the top transducer assembly 200 for conversion into corresponding acoustic energy. The electrical energy signal source 9 is operably coupled to and controlled by the controller 12. As a result, the controller 12 will dictate the frequency, power level, and duration of the acoustic energy generated by the top transducer assembly 200. Preferably, the electrical energy signal source 9 is controlled so that the acoustic energy generated by the top transducer assembly 200 has a frequency in the megasonic range.

The controller 12 may be a processor, which can be a suitable microprocessor based programmable logic controller, personal computer, or the like for process control. The controller 12 preferably includes various input/output ports used to provide connections to the various components of the cleaning system 1000 that need to be controlled and/or communicated with. The electrical and/or communication connections are indicated in dotted line in FIG. 2. The controller 12 also preferably comprises sufficient memory to store process recipes and other data, such as thresholds inputted by an operator, processing times, rotational speeds, processing conditions, processing temperatures, flow rates, desired concentrations, sequence operations, and the like. The controller 12 can communicate with the various components of the cleaning system 1000 to automatically adjust process conditions, such as flow rates, rotational speed, movement of the components of the cleaning system 1000, etc. as necessary. The type of system controller used for any given system will depend on the exact needs of the system in which it is incorporated.

As will be noted, the top transducer assembly 200 is generically illustrated as a box. This is done because, in its broadest sense, the invention is not limited to any particular structure, shape and/or assembly arrangement for the transducer assembly 200. For example, any of the transducer assemblies disclosed in U.S. Pat. No. 6,039,059 ("Bran"), issued Mar. 21, 2000, U.S. Pat. No. 7,145,286 ("Beck et al."), issued Dec. 5, 2006, U.S. Pat. No. 6,539,952 ("Itzkowitz"), issued Apr. 1, 2003, and United States Patent Application Publication 2006/0278253 ("Verhaverbeke et al."), published Dec. 14, 2006, can be used as the top transducer assembly 200. Of course, other styles of transducer assemblies can be used, such as those having an elongated transmitter rod supported at an angle to the surface of the wafer.

Figure 2:
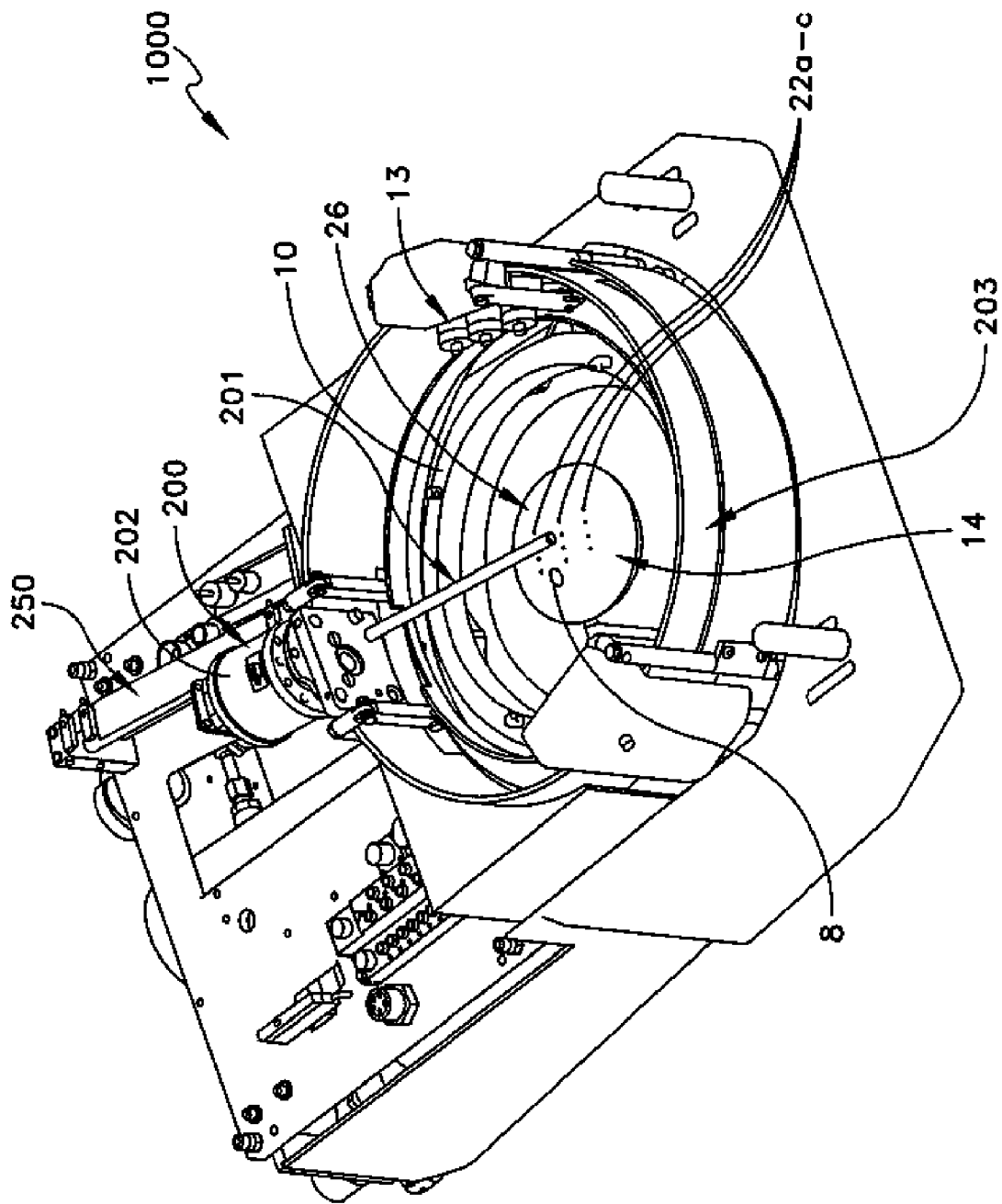
FIG. 2 is a perspective view of a cleaning system according to one embodiment of the present invention.

Referring now to FIG. 2, a preferred structural embodiment of the cleaning system 1000 is illustrated. Like numbers are used in FIGS. 2-13 to indicate the corresponding structural manifestation of the schematically illustrated components of FIG. 1.

In the cleaning system 1000 of FIG. 2, the top transducer assembly 200 comprises an elongate rod-like transmitter 201 that is acoustically coupled to a transducer 203 that is located within housing 202. Many of the details of this style of elongate rod-like transmitter 201 are disclosed in U.S. Pat. No. 6,684,891 ("Bran"), issued Feb. 3, 2004 and U.S. Pat. No. 6,892,738 ("Bran et al."), issued May 17, 2005, the entireties of which are hereby incorporated by reference. The top transducer assembly 200 is operably coupled to drive assembly/actuator 250 that can move the rod-like transmitter 201 between a retracted position and a processing position. When the rod-like transmitter 201 is in the retracted position, the rod-like transmitter 201 is located outside of the process bowl 203 so that a wafer 50 can be placed on the rotatable support 10 without obstruction. More specifically, the drive assembly 250 withdraws the rod-like transmitter 201 through an opening in a side wall of the process bowl 203. When in the processing position, the rod-like transmitter 201 is positioned directly above the top surface 51 of a wafer 50 on the rotatable support 10. The rod-like transmitter 201 is in the processing position in FIG. 2.

The transducer 203 of the top transducer assemblies 200 is acoustically coupled to the transmitter 201. This can be done through a direct bonding or an indirect bonding that utilizes intermediary transmission layers. The transducer 203 is operably coupled to a source of an electrical energy signal. The transducer 203 can be a piezoelectric ceramic or crystal, as is well known in the art.

It can be seen that the rotatable support 10 is located within the process bowl 203. The rotatable support 10 supports a wafer 50 (shown in FIG. 1) in a substantially horizontal orientation in the gaseous atmosphere of the process bowl 203, which surrounds the periphery of the wafer 50. The rotatable support 10 is operably connected to the motor assembly 11. The motor assembly rotates the wafer about the central axis. The motor assembly 11 can be a direct drive motor or a bearing with offset belt/pulley drive.

The rotatable support 10 supports the wafer 50 (shown in FIG. 1) at an elevation and position between the elongate rod-like transmitter 201 of the top transducer assembly 200 and the top surface 26 of the dispenser 14. When the wafer 50 is so supported, the transmitter 201 of the top transducer assembly 200 extends in a substantially parallel orientation over the top surface 51 of the wafer 50 in a close spaced relation. This close spaced relationship is such that when liquid is applied to the top surface 51 from the top dispenser 13, a meniscus of liquid is formed between a portion of the transmitter 201 and the top surface 51 of the wafer 50. The dispenser 14 is used for applying various fluids to the bottom surface 56 of the substrate 50. The invention is not so limited however, and the dispenser 14 could be used to apply fluid to any surface of the substrate 50. The top surface 26 of the dispenser 14 is a substantially dome-shaped surface and comprises a plurality of holes 22$a$-$c$, 32$a$-$c$, 42$a$-$c$, 52$a$-$c$ (shown in FIG. 3). As will be discussed in further detail below, each of the holes 22$a$-$c$, 32$a$-$c$, 42$a$-$c$, 52$a$-$c$ is connected to a conduit that is adapted to eject fluid from the dispenser 14 and onto the surface of the wafer 50.

The cleaning system 1000 further comprises a sensor 8. The sensor 8 is provided for determining the presence of a substrate on the support 10. The sensor is operably and communicably coupled to the controller 12. More specifically, the sensor 8 generates a signal indicative of the presence of the wafer 50 (shown in FIG. 1) and transmits this signal to the controller 12 for processing. While the sensor 8 is shown as being on the top surface 26 of the dispenser 14, the sensor 8 can be mounted almost anywhere in the cleaning system 1000 so long as it can perform its function.

Referring to FIGS. 3-12, the dispenser 14 is illustrated removed from the cleaning system 1000 so that its details are more clearly visible. It should be understood that the dispenser 14, in and of itself, is a novel device and can constitute an embodiment of the invention, independent of the remaining components of the cleaning system 1000.

Figure 3:
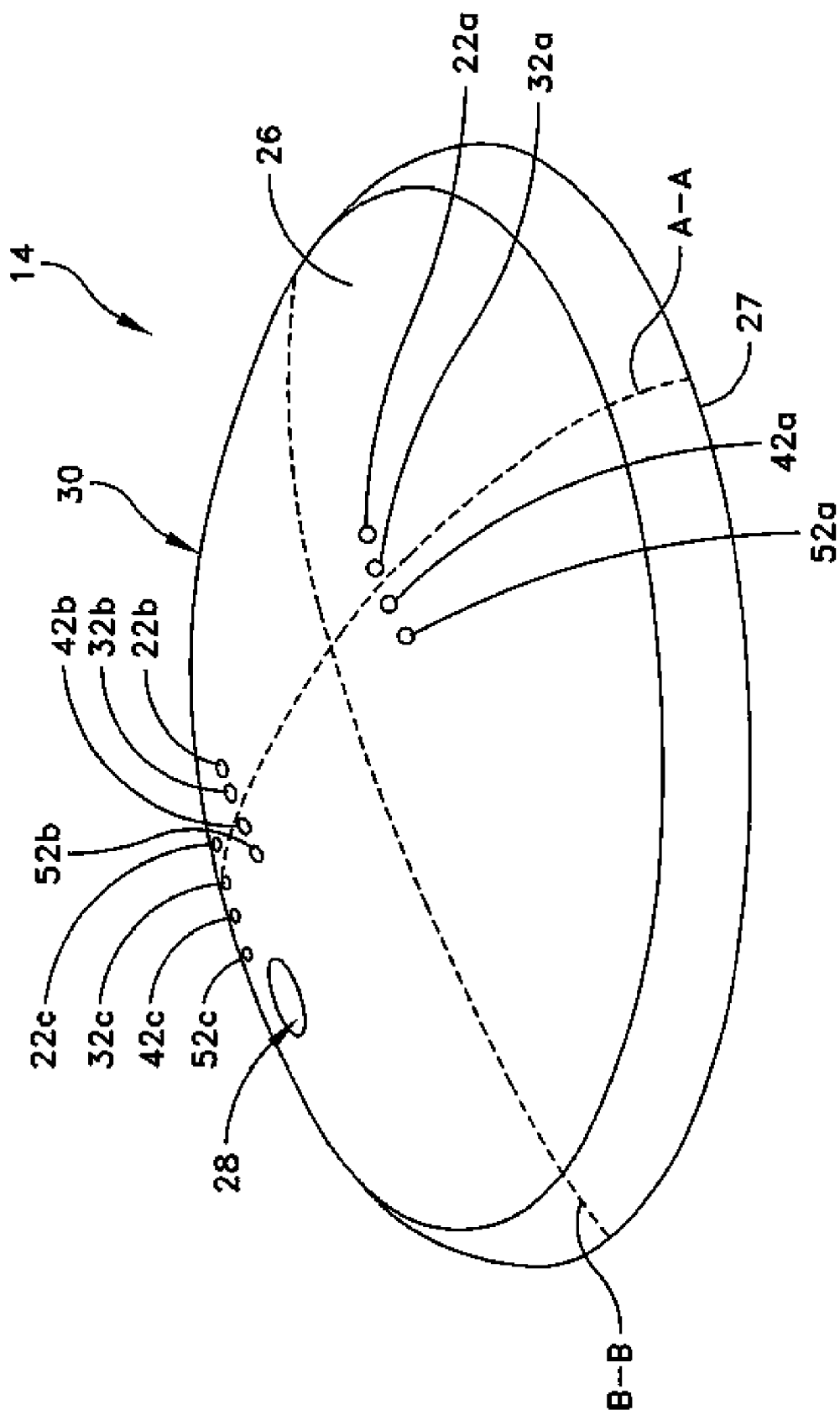
FIG. 3 is a top perspective view of a liquid dispenser according to one embodiment of the present invention.
Figure 4:
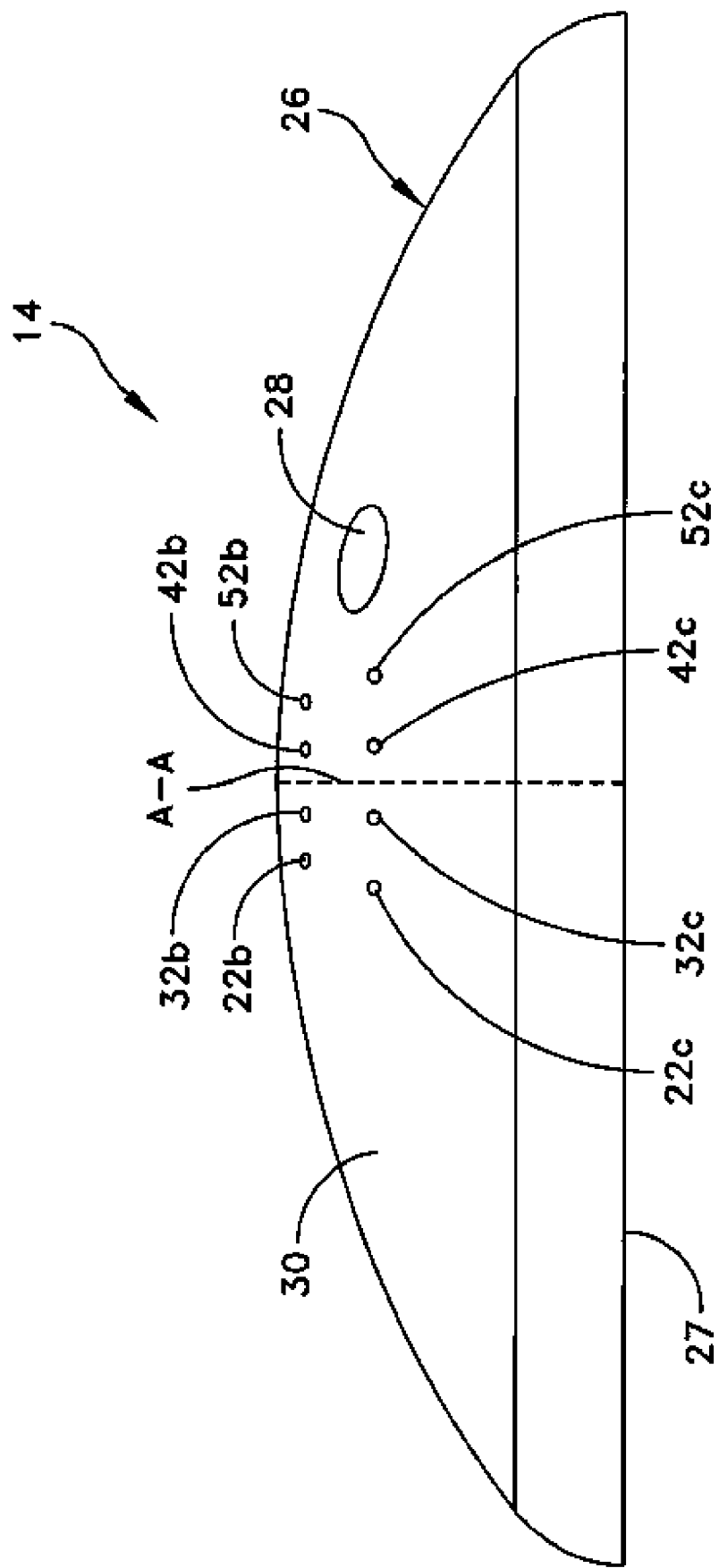
FIG. 4 is a side view of the liquid dispenser of FIG. 3.

Referring now to FIGS. 3 and 4 concurrently, the dispenser 14 comprises a dome-like shaped body 30 having a top surface 26 and a bottom surface 27. In the illustrated embodiment, the body 30 is a plano-convex shaped structure. The invention is not so limited however, and the body 30 could be any shape resulting in an upper surface that has a convex curvature in both the longitudinal direction (along line A-A) and the transverse direction (along line B-B). Such alternative shapes include, without limitation, convex-convex, par-spherical, oblate-par-spheroidal, ellipsoidal, and so forth. Additionally, rather than being a convex curved surface, the top surface 26 could be made of small planar sections arranged so as to resemble a surface having curvature. The convex curved shape of the top surface 26 allows for fluid and contaminants that may fall onto the dispenser 14 to more easily flow off of the top surface 26 and away from the substrate being processed than would a planar surface. The dispenser 14 has a height of about 1.3 inches and a diameter of about 5.5 inches. The dispenser 14 can be made of Teflon, PTFE, PFA and/or other inert non-contaminating materials. The invention is not so limited however, and the specific dimensions and materials of the dispenser 14 will vary according to the process requirements.

The dispenser 14 further comprises a plurality of holes 22$a$-$c$, 32$a$-$c$, 42$a$-$c$, 52$a$-$c$ for ejecting fluid onto the surface of a substrate to be processed. In some embodiments, the holes 22$a$-$e$, 32$a$-$c$, 42$a$-$c$, 52$a$-$c$ have a diameter that is between 0.05 inches and 0.09 inches. The invention however, is not so limited and the exact size and shape of the holes 22$a$-$c$, 32$a$-$c$, 42$a$-$c$, 52$a$-$c$ can vary. The exact shape and size of the holes 22$a$-$c$, 32$a$-$c$, 42$a$-$c$, 52$a$-$c$ will be dictated by the process requirements.

Figure 5:
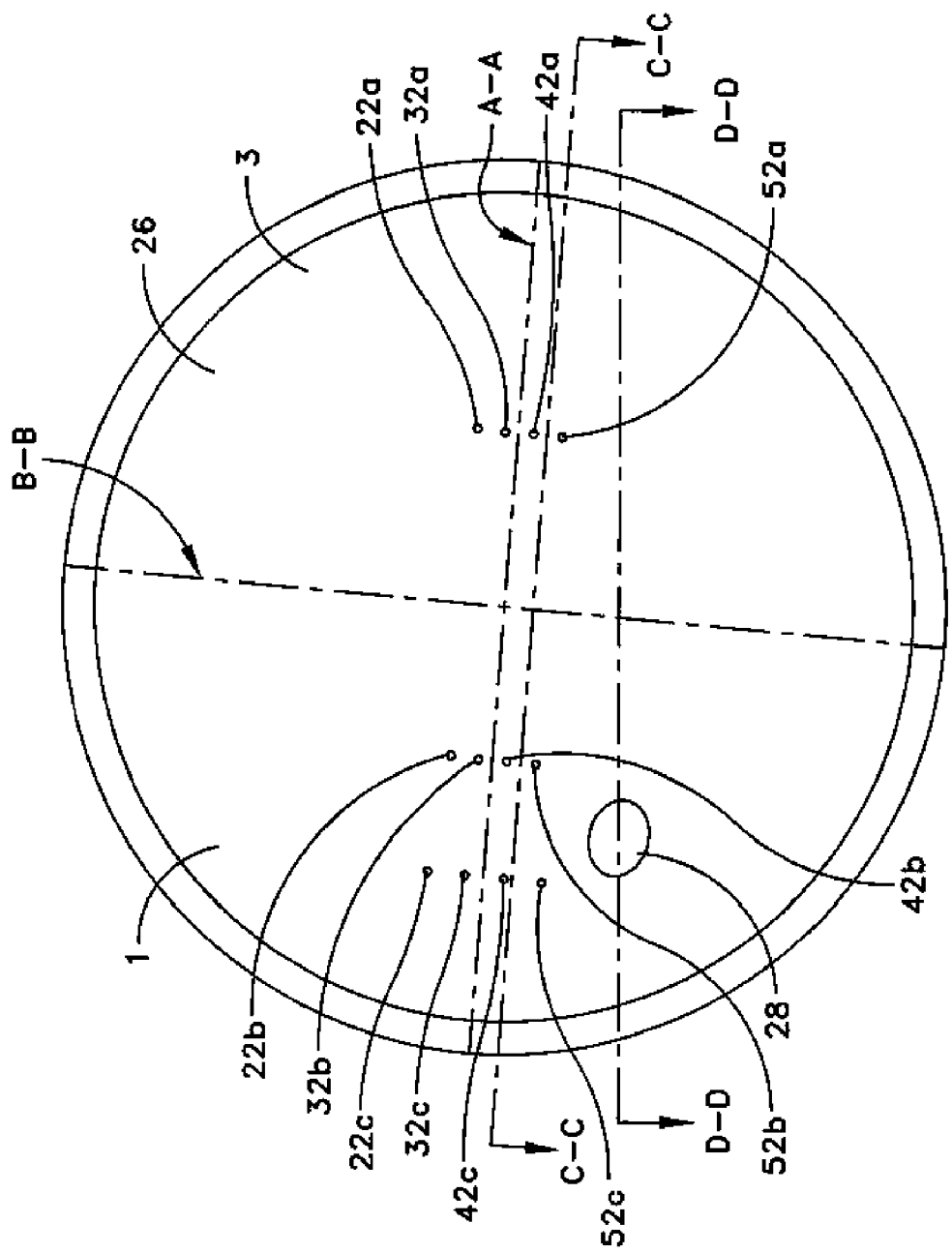
FIG. 5 is a top view of the liquid dispenser of FIG. 3.

Referring now to FIG. 5, a top view of the dispenser 14 is illustrated to more clearly show the positioning of the holes 22$a$-$c$, 32$a$-$c$, 42$a$-$c$, 52$a$-$c$ in the top surface 26 of the dispenser 14. For ease of discussion, the longitudinal center-line A-A and the transverse center-line B-B of the body 30 of the dispenser 14 are shown. The intersection of the longitudinal center-line A-A and the transverse center-line B-B will be referred to as the central axis point of the body 30 of the dispenser 14. Conceptually, the dispenser 14 may be divided into a front end 1 and a back end 3. It should be understood that the division of the dispenser 14 into front and back is for ease of discussion only, and the dispenser 14 is in reality one structure. The holes 22$a$-$c$, 32$a$-$c$, 42$a$-$c$, 52$a$-$c$ are positioned on the top surface 26 so as to form a matrix of four rows by three columns. Each row is referred to as an array. In the illustrated embodiment, each array comprises three of the holes 22$a$-$c$, 32$a$-$c$, 42$a$-$c$, 52$a$-$c$. The first and second arrays of holes 22$a$-$c$, 32$a$-$c$ are on one side of the longitudinal center-line A-A, while the third and fourth arrays of holes 42$a$-$c$, 52$a$-$c$ are on the other side of the longitudinal center-line A-A. As will be discussed in more detail below, during the processing of a substrate it is possible to use only one array at a time, and each array can be adapted to dispense a different type of fluid. The first column of holes 22$a$, 32$a$, 42$a$, 52$a$ is on the back end 3 of the dispenser 14 (to the right of the transverse center-line B-B), while the second and third columns of holes 22$b$-$c$, 32$b$-$c$, 42$b$-$c$, 52$b$-$c$, are on the front end 1 of the dispenser 14 (to the left side of the transverse center-line B-B).

Figure 6:
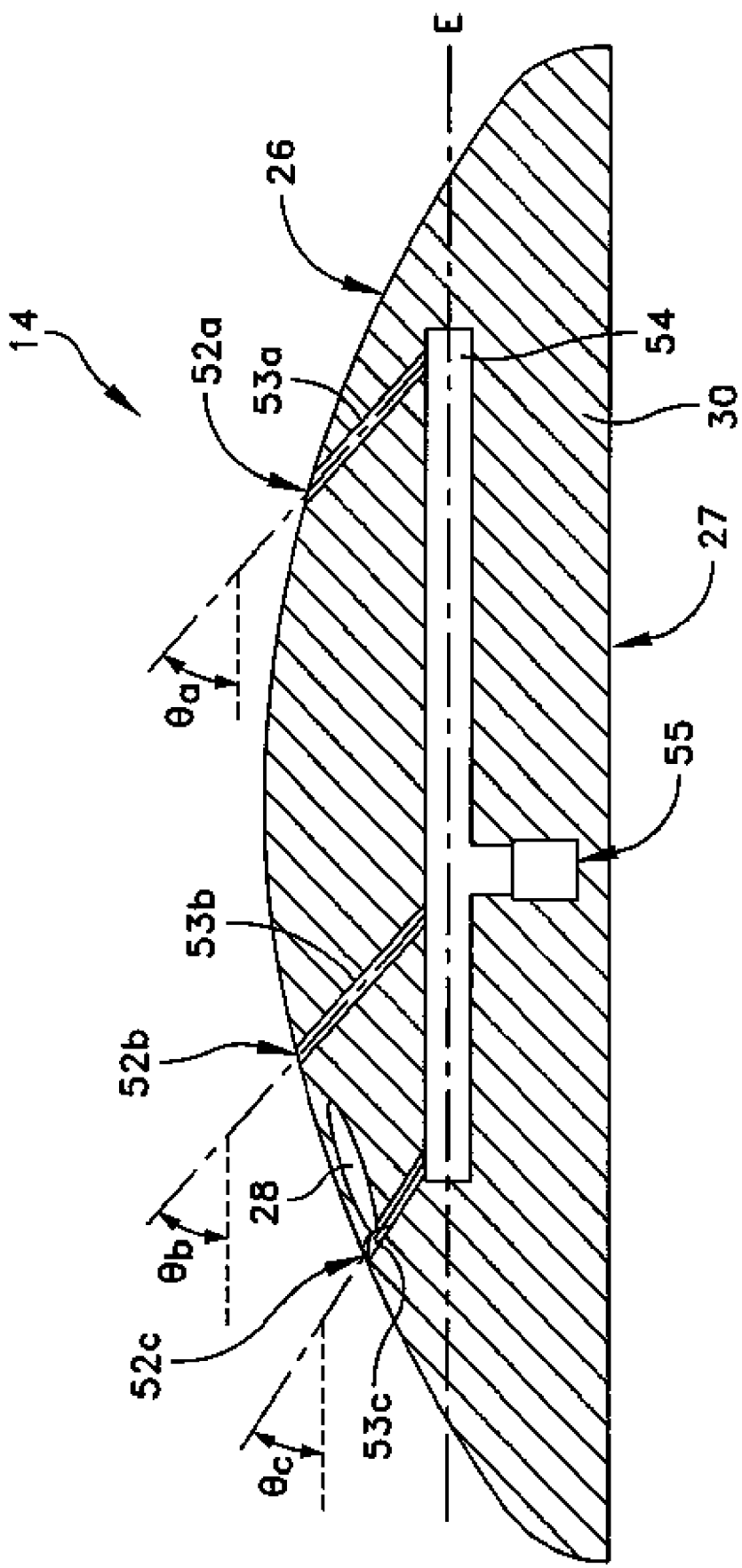
FIG. 6 is a cross-sectional view of the liquid dispenser along line C-C of FIG. 5.

Referring now to FIG. 6, a cross-sectional side view of dispenser 14 along axis C-C of FIG. 5 is illustrated. Also illustrated, for purposes of discussion, is the horizontal plane E. The horizontal plane E is substantially parallel to the bottom surface 56 of a wafer 50 positioned on the rotatable support to be processed (shown in FIG. 13). The holes 22$a$-$c$, 32$a$-$c$, 42$a$-$c$, 52$a$-$c$ are the openings of the conduits 23$a$-$c$, 33$a$-$c$, 43$a$-$c$, 53$a$-$c$ in the top surface 26 of the body 30 of the dispenser 14. For ease of discussion, only one array of the conduits 53$a$-$c$ is shown in this cross-sectional view. However, the features of the conduits 53$a$-$c$ shown in this view are identical across all four arrays. The variations between the arrays will be discussed with reference to FIGS. 9-12. The array of the conduits 53$a$-$c$ is fluidly connected to a header 54. The header 54 is in turn connected to a liquid reservoir 15A-D (shown in FIG. 1) via a fluid inlet passageway 55. Thus, fluid is supplied to the header 54 and into each conduit 53$a$-$c$ where it will then exit through the holes 52a-c at an angle θa-c. Although only one header 54 is shown illustrated, there are four headers 24, 34, 44, 54, within the body 30 of the dispenser 14. Each header 24, 34, 44, 54 is connected to an array of the conduits 23a-c, 33a-c, 43a-c, 53a-c and has a separate fluid inlet 25, 35, 45, 55 (shown in FIG. 8). Thus, dispenser 14 is a single head unit capable of ejecting four different fluids via the four headers 24, 34, 44, 54. The invention is not so limited, however, and less or more than four headers may be used, including no header. For example, each conduit 23a-c, 33a-c, 43a-c, 53a-c may be fluidly connected directly with the source of fluid.

The headers 24, 34, 44, 54 are located, within the body 30 of the dispenser 14. While the body of the dispenser 14 is illustrated as a solid structure with the headers formed as cylindrical cavities within the body 30, the invention is not so limited. In other embodiments of the invention, the body 30 may be a shell-like structure wherein the headers 24, 34, 44, 54 are separate tubular components and all fluid passageways are formed by flexible fluid conduit. Moreover, in some embodiments, the headers 24, 34, 44, 54 can be located exterior to the body 30, if desired.

The first column of conduits 23a, 33a, 43a, 53a, is at a first angle θa relative to the horizontal plane E. The second, column of conduits 23b, 33b, 43b, 53b is at a second angle θb relative to the horizontal plane E. The third column of conduits 23c, 33c, 43c, 53c is at a third angle θc relative to the horizontal plane E. The first and second angles θa and θb are preferably between 35° to 45°, more preferably between 40° and 45°, and most preferably equal to 40°. The third angle θc is preferably between 30° to 35°, more preferably between 33° and 35°, and most preferably equal to 33°. The angles θa-c, however will vary depending on the desired point of contact between the ejected fluid and the bottom surface 56 of the wafer, the distance between the dispenser 14 and the wafer, the angle of the bottom surface of the wafer relative to the top surface of the dispenser, the respective sizes of the wafer and the dispenser, and the position of the conduits 23a-c, 33a-c, 43a-c, 53a-c on the dispenser 14.

Figure 7:
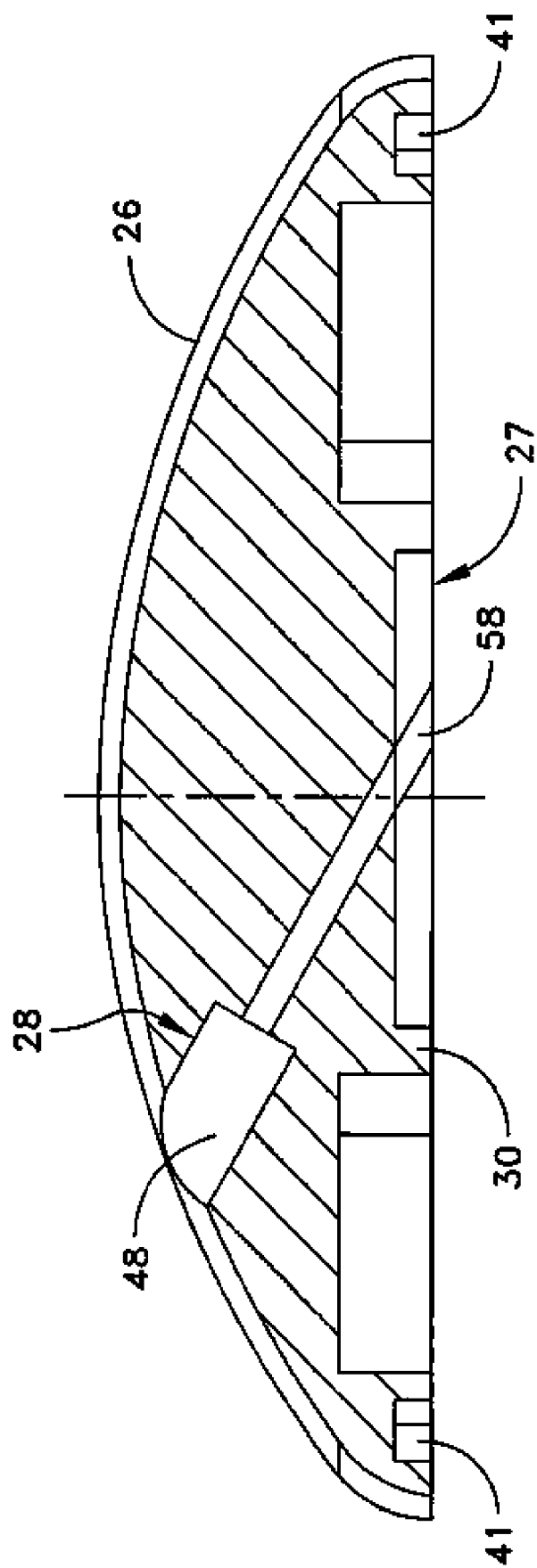
FIG. 7 is a cross-sectional view of the liquid dispenser along line D-D of FIG. 5.

Turning now to FIG. 7, a cross-sectional side view of the dispenser 14 is shown along axis D-D of FIG. 5. This side view is shown to illustrate the details of the sensor hole 28. The sensor hole 28 provides a cavity for holding the sensor 8 (shown in FIG. 2). The sensor hole 28 extends from the top surface 26 of dispenser 14 to the bottom surface 27 of dispenser 14. The upper portion 48 of sensor hole 28 is wider than the lower portion 58 of sensor hole 27. The sensor 8 rests in the upper portion 48 of the sensor hole 28, while the lower portion 58 is used for the electrical connections and other components that connect the sensor 8 to the controller 12 (shown in FIG. 1). When fully assembled, the sensor 8 rests in the sensor hole 28 which is hermetically sealed so that fluid does not enter the sensor hole 28. The seal is accomplished using any conventional means known in the art including using gaskets, o-rings, and the like. The upper portion 48 of the sensor hole 28 has a diameter that is between 0.39 inches and 0.41 inches. The lower portion 58 of the sensor hole 28 has a diameter that is about 0.125 inches. The sensor hole 28 extends through the body 30 at an angle of about 28 degrees relative to a horizontal plane. The invention is not so limited, however, and the exact shape and size of the sensor hole 28 are determined according to the type and size of sensor 8 to be used.

Figure 8:
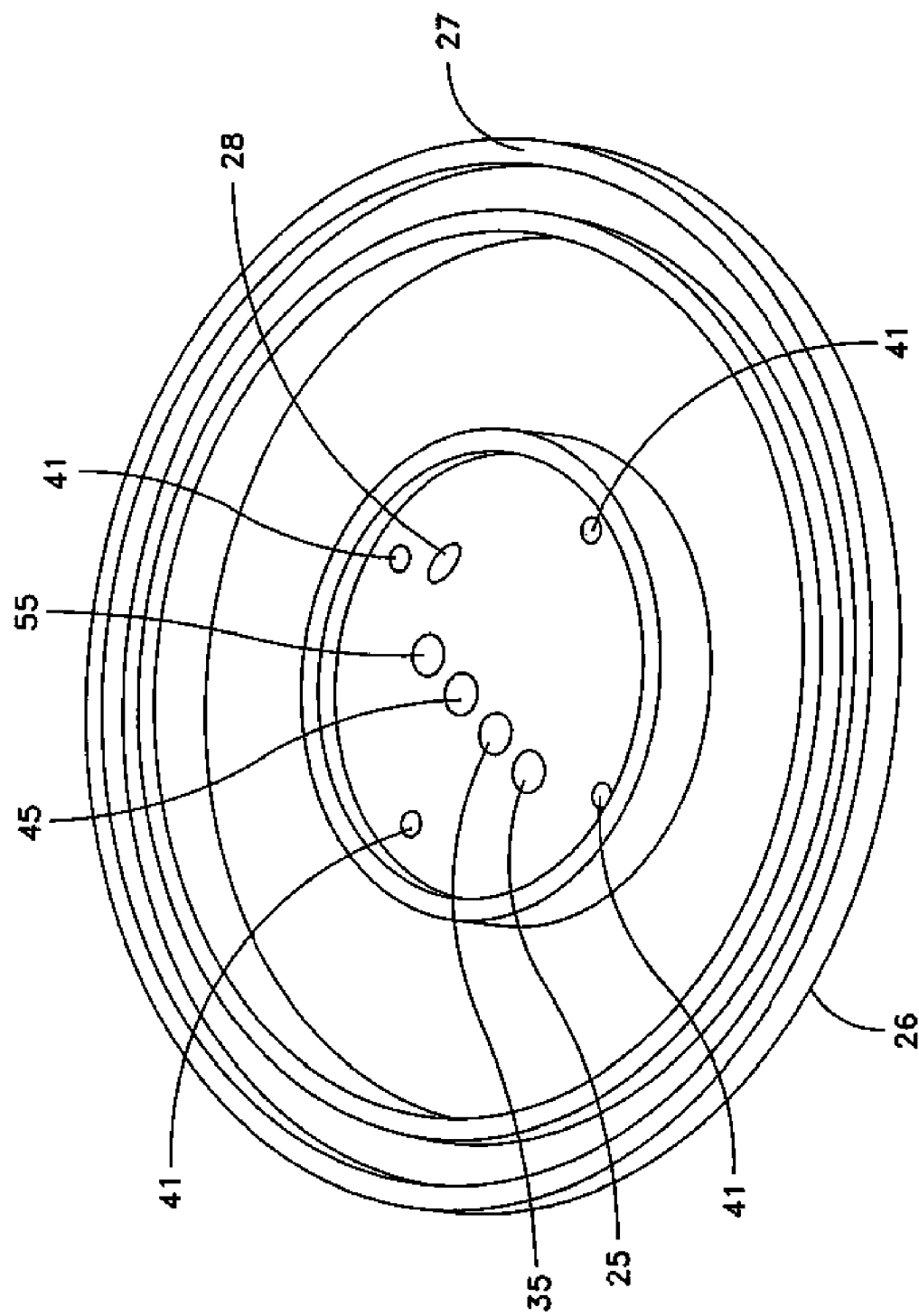
FIG. 8 is a bottom perspective view of a liquid dispenser according to one embodiment of the present invention.

Referring now to FIG. 8, a bottom view of the dispenser 14 is shown. The dispenser 14 comprises four bolt holes 41 for bolts that may be used for securing together the components of dispenser 14 and for mounting the dispenser 14 in the cleaning system 1000. The dispenser 14 comprises four fluid inlet passageways 25, 35, 45, 55. The fluid inlet passageways 25, 35, 45, 55 are passageways that extend into the headers 24, 34, 44, 54, respectively. As will be discussed in further detail during operation, the fluid inlet passageways 25, 35, 45, 55 are each fluidly coupled to its own liquid reservoir 15A-D (shown in FIG. 1). Alternatively, all four fluid inlet passageways 25, 35, 45, 55 may be connected with one liquid reservoir.

This allows for the ejection of four different fluids through a single head unit without having to purge the unit.

Referring now to FIGS. 9-12 concurrently, a schematical view of the dispenser 14 is illustrated so that the positioning of each array of the conduits 23a-c, 33a-c, 43a-c, 53a-c relative to a vertical plane F can be described. The vertical plane F is a plane that intersects the longitudinal center-line A-A of the dispenser 14 (shown in FIG. 5). All of the conduits 23a-c, 33a-c, 43a-c, 53a-c in the four arrays are angled towards the longitudinal center-line A-A so that the fluid dispensed through the holes 22a-c, 32a-c, 42a-c, 52a-c will strike a surface of the wafer 50 directly above the longitudinal center-line A-A.

Figure 9:
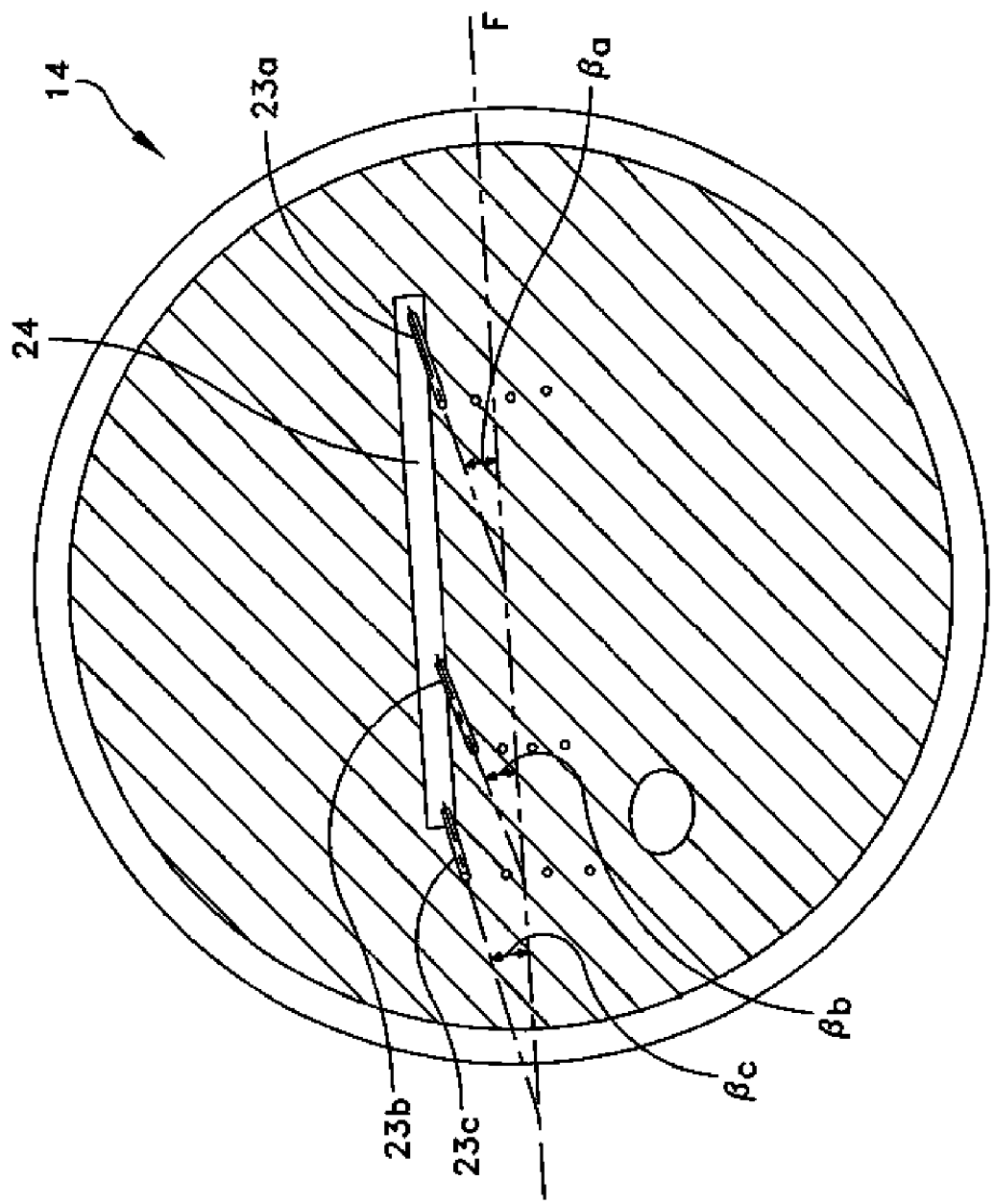
FIG. 9 is a top view of the liquid dispenser wherein an internal first header and first array of conduits is illustrated.

Referring now to FIG. 9, The first array of conduits 23a-c are connected to the first header 24. The first conduit 23a of the first header 24 is at an angle βa relative to the vertical plane F. The second conduit 23b of the first header 24 is at an angle βb relative to the vertical plane F. The third conduit 23c of the first header 24 is at an angle βc relative to the vertical plane F. In one embodiment of the present invention, βa is about 15.5°, βb is about 18° and βc is about 12.5°. The invention is not so limited however, and the angles of the conduits 23a-c is dependent upon the positioning of the wafer 50 relative to the dispenser 14 and the position of the holes 22a-c on the dispenser 14. The angle should be one that results in the ejected fluid initially contacting the wafer 50 along a line where the vertical plane F would intersect the surface 56 of the wafer 50.

Figure 10:
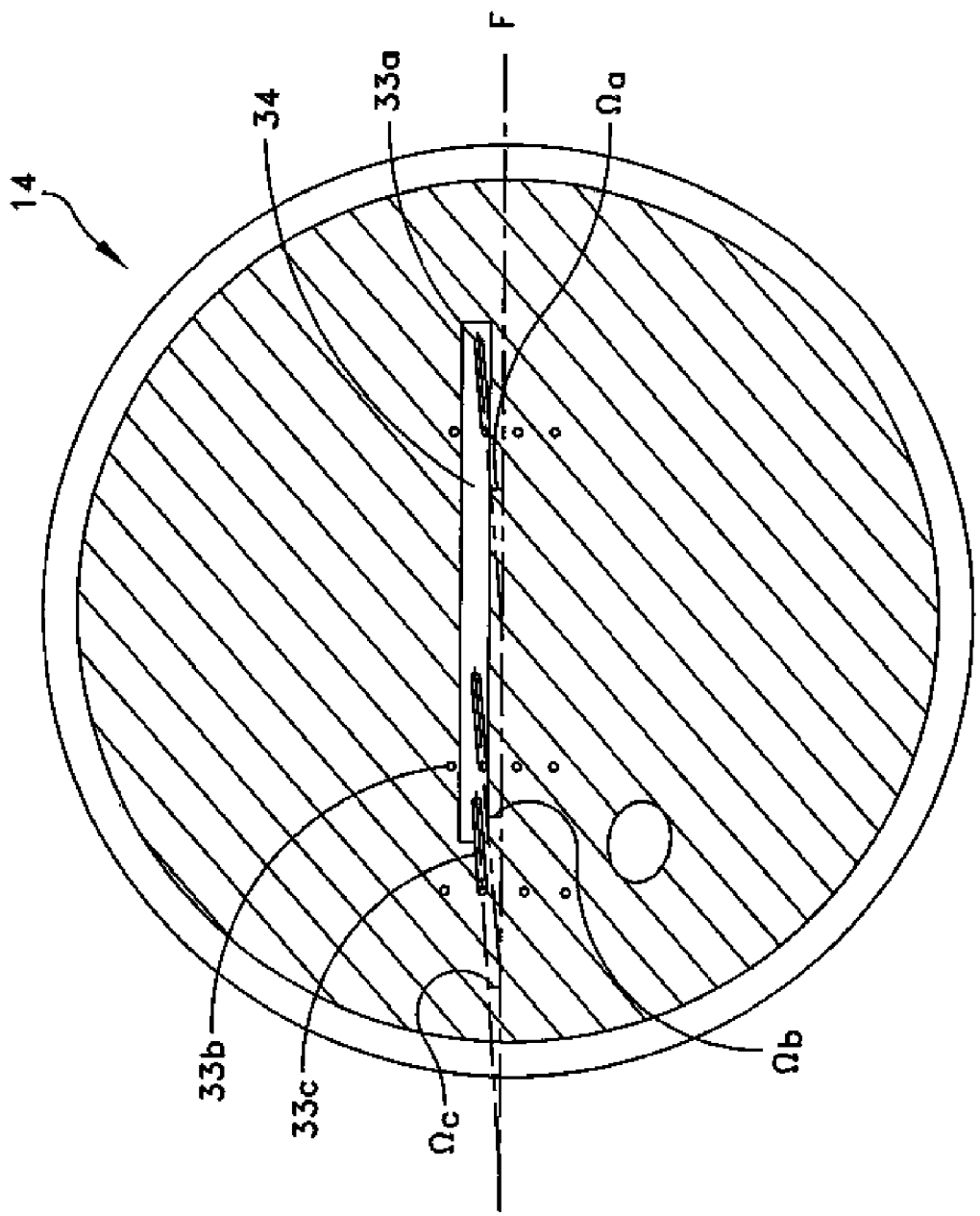
FIG. 10 is a top view of the liquid dispenser wherein an internal second header and second array of conduits is illustrated.

Referring now to FIG. 10, the second array of conduits 33a-c are shown connected to a second header 34. The first conduit 33a of the second header 34 is at an angle Ωa relative to the vertical plane F. The second conduit 33b of the second header 34 is at an angle Ωb relative to the vertical plane F. The third conduit 33c of the second header 34 is at an angle Ωc relative to the vertical plane F. In one embodiment of the present invention, Ωa is about 5.3°, Ωb is about 6.2° and Ωc is about 4.3°. Again, positioning of the conduits 33a-c is not limited to any particular angle, so long as the ejected fluid initially contacts the wafer 50 at a predetermined point intersected by the vertical plane F.

Figure 11:
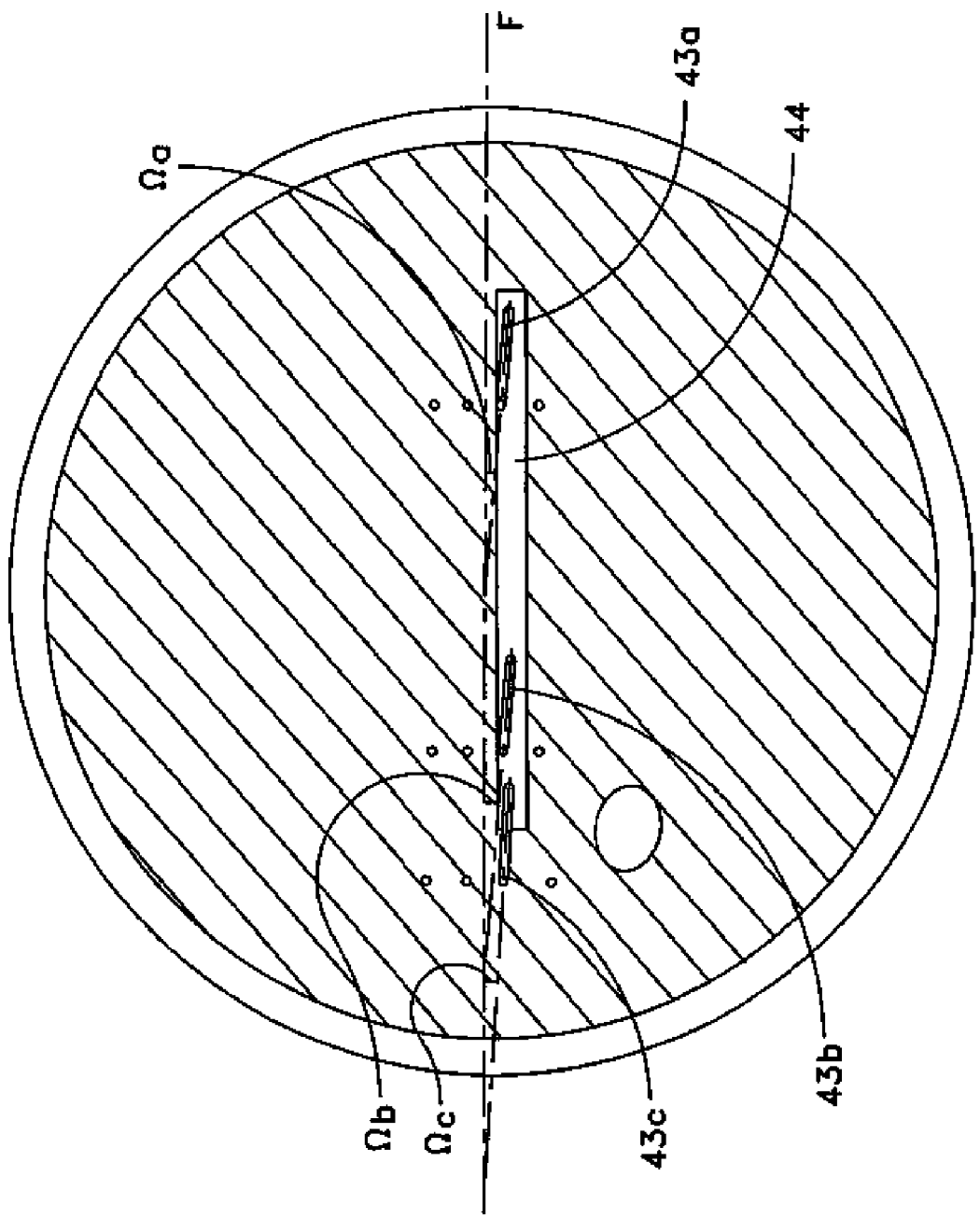
FIG. 11 is a top view of the liquid dispenser wherein an internal third header and third array of conduits is illustrated.

Referring now to FIG. 11, the third array of the conduits 43a-c is shown connected to the third header 44. Because dispenser 14 is symmetrical about its longitudinal center-line A-A, the angles of the conduits 43a-c connected to the third header 44 are a mirror of the conduits 33a-c connected to the second header 34 as discussed above with respect to FIG. 10. The first conduit 43a is at an angle −Ωa, the second conduit 43b is at an angle −Ωb and the third conduit 43c is at an angle −Ωc.

Figure 12:
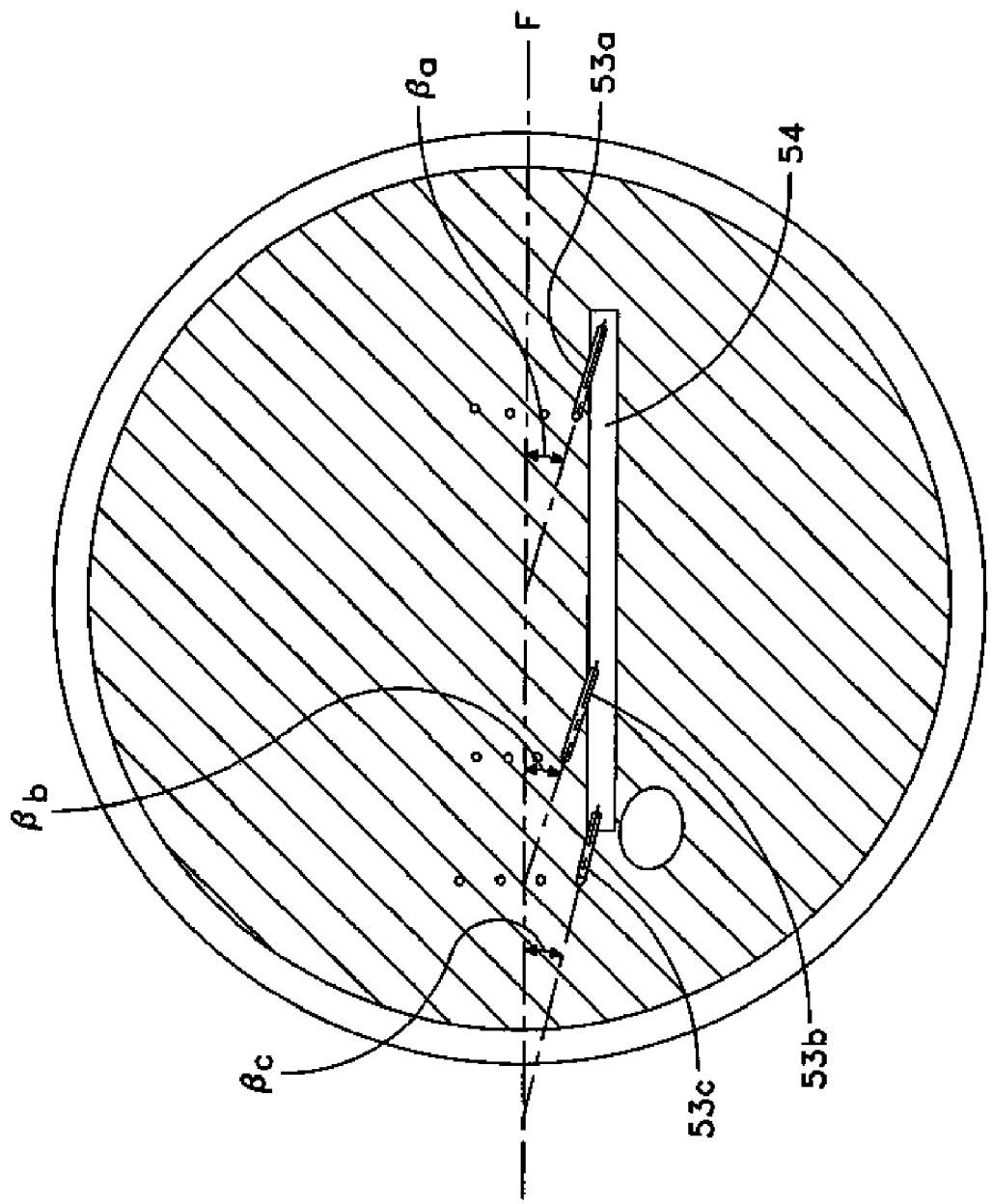
FIG. 12 is a top view of the liquid dispenser wherein an internal fourth header and fourth array of conduits is illustrated.

Similarly, FIG. 12 is an illustration of the fourth array of the conduits 53a-c connected to the fourth header 54. The conduits 53a-c that are connected to the fourth header 54 are a mirror image and angled to the same degree (towards the center-line) as the conduits 23a-c connected to the first header 24, discussed above with respect to FIG. 9. The first conduit 53a is at an angle −βa, the second conduit 53b is at an angle −βb and the third conduit 53c is at an angle −βc.

Figure 13:
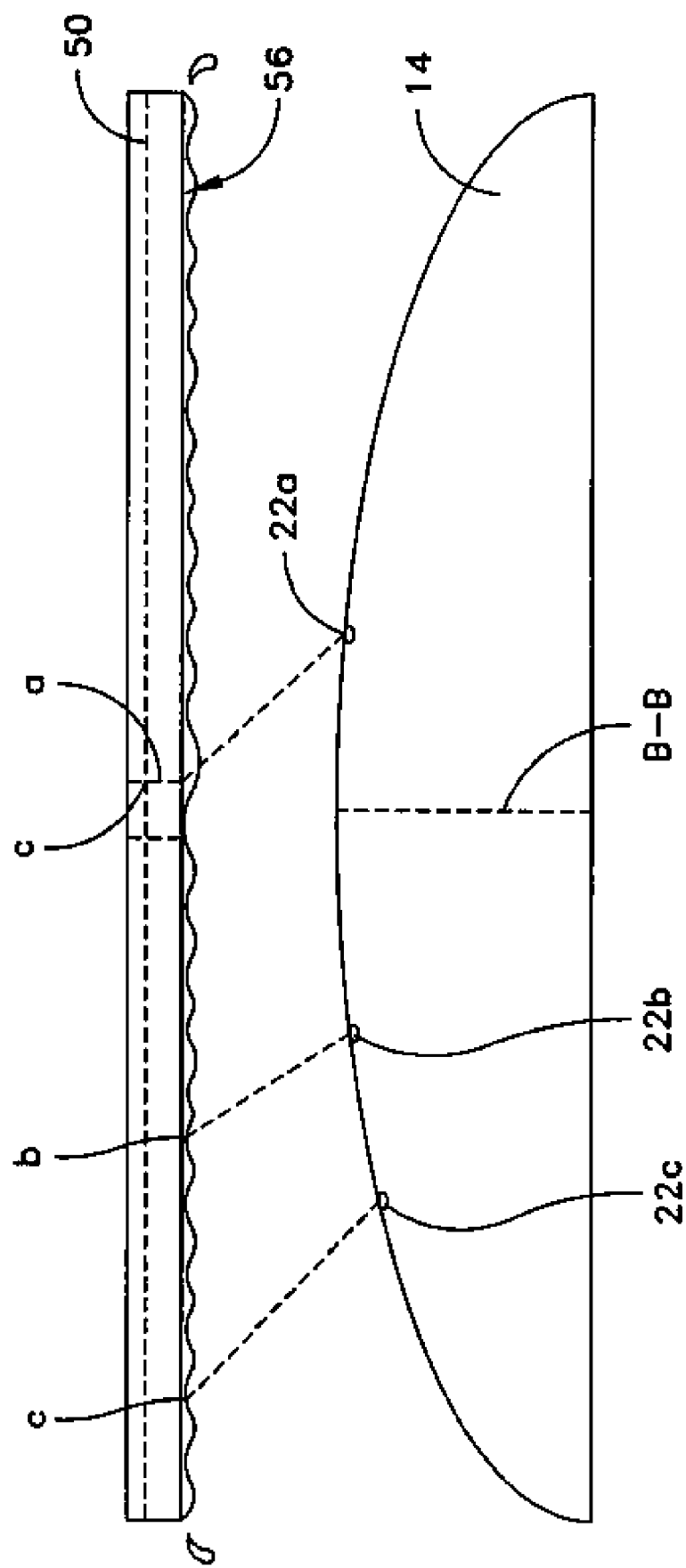
FIG. 13 is a schematic illustrating a liquid ejection profile according to one embodiment of the present invention.

Referring now to FIG. 13, a schematic illustrating a liquid ejection profile according to one embodiment of the present invention is shown. The dispenser 14 is illustrated positioned below the wafer 50. The wafer 50 is positioned substantially horizontal and parallel with the dispenser 14. The wafer 50 has a transverse center-line, a longitudinal center-line, and a rotational, center-point C where the two center-lines intersect. Although in this case the rotational center-point C of the wafer is the actual center-point, in alternative embodiments, the rotational center-point C does not have to be the actual center-point of the wafer. The rotational center-point of the wafer 50 is offset from the center axis point (at the apex) of the body 30 of the dispenser 14. The longitudinal centerline of the wafer 50 and the longitudinal centerline of the dispenser 14 are aligned. Fluid is ejected through the conduits 23a-c, 33a-c, 43a-c, 53a-c and out of the holes 22a-c, 32a-c, 42a-c, 52a-c. The ejected fluid strikes the bottom surface 56 of the wafer 50 at the predetermined points a, b, c. Point a is the rotational center point of the wafer 50. In the illustrated embodiment, point b is equal to ⅓ the radius of the wafer 50. Point c is equal to ⅔ the radius of the wafer 50. While the fluid is ejected, the wafer 50 is rotated about its rotational center-point, and a film of fluid covers the bottom surface of the wafer 50. As discussed above, the dispenser 14 comprises four separate arrays of the conduits 23a-c, 33a-c, 43a-c, 53a-c, thus each array may be used to dispense a different fluid from the other. As such, after a first fluid is dispensed, a second, third and fourth fluids may be dispensed in turn onto the surface of the wafer 50. Alternatively, four fluids can be dispensed at the same time onto the surface of the wafer 50.

In one embodiment of the present invention, each fluid inlet passageway 25, 35, 45, 55 is connected to a separate liquid reservoir 15A-D so that a different fluid can be introduced into each header 24, 34, 44, 54. For example, liquid reservoir 15A could be filled with deionized water ("DIW"), liquid reservoir 15B could be filled with standard clean 1 ("SC1"), liquid reservoir 15C could be filled with standard clean 2 ("SC2") and liquid reservoir 15D could be filled with ozonated deionized water ("DIO$_3$"). In that embodiment, the conduits 23a-c, which are connected to the liquid reservoir 15A via the fluid inlet passageway 25 and the first header 24 (shown in FIG. 9), would eject DIW onto the bottom surface 56 of the wafer 50. The conduits 33a-c, which are connected to the liquid reservoir 15B via the fluid passageway 35 and the second header 34 (shown in FIG. 10) would eject SC1. The conduits 43a-c, winch are connected to the liquid reservoir 15C via the fluid passageway 45 and third header 44 (shown in FIG. 11), would eject SC2. The conduits 53a-c, which are connected to the liquid reservoir 15D via the fluid inlet passageway 55 and the fourth header 54 (shown in FIG. 12) would eject DIO$_3$. Thus, four fluids are ejected via single head unit, i.e. dispenser 14. The fluid flow rate can be about 1800 ml/min., however the flow rate will vary according to the process requirements.

It is to be understood that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A system for processing substrates comprising:
a rotatable support for supporting and rotating a substrate about a rotational center-point;
a liquid dispensing apparatus comprising a body with a substantially dome-shaped outer surface, a first angled conduit terminating as a first hole in the outer surface of the body and a second conduit terminating as a second hole in the outer surface of the body; and
wherein the first hole is offset a radial distance from the rotational center-point of the substrate, the first angled conduit oriented to eject liquid out of the first hole into contact with the surface of the substrate at or near the rotational center-point, the second conduit oriented and positioned to eject liquid out of the second hole into contact with the surface of the substrate at a first radial distance from the rotational center-point;
a first header and a second header;
the first and second conduits forming a first array of conduits fluidly coupled to the first header;
a second array of conduits fluidly coupled to the second header;
the outer surface of the body comprising a longitudinal center-line;
the first and second holes located on one side of the longitudinal center-line and the second array of the conduits terminating in holes in the outer surface of the body located on the other side of the longitudinal center-line; and
wherein the conduits of the first and second arrays are positioned and oriented to eject liquid into contact with the surface of the substrate at locations intersected by a longitudinal center plane of the body.

2. A system for processing substrates comprising:
a rotatable support for supporting and rotating a substrate about a rotational center-point; and
a fluid dispensing apparatus comprising a body, a first header and a second header;
the first header having an inlet adapted to introduce a first fluid into the first header;
the second header having an inlet adapted to introduce a second fluid into the second header;
a first array of conduits extending from the first header and terminating as holes in an outer surface of the body, the first array of conduits adapted to eject the first fluid from the first header and onto a substrate located on the rotatable support; and
a second array of conduits extending from the second header and terminating as holes in the outer surface of the body, the second array of conduits adapted to eject the second fluid from the second header and onto a substrate located on the rotatable support;
the body comprising a longitudinal center plane;
the first array of conduits located on one side of the longitudinal center plane and the second array of conduits located on the other side of the longitudinal center plane; and
wherein the conduits of the first and second arrays are positioned and oriented to eject fluid into contact with a surface of the substrate at locations intersected by the longitudinal center plane of the body.

3. An apparatus for applying a liquid to a surface of a substrate comprising:
a body having a first header and a second header;
a first inlet for introducing a first fluid into the first header;
a second inlet for introducing a second fluid into the second header;
a first array of conduits extending from the first header and terminating as holes in an outer surface of the body, the first array of conduits adapted to eject the first fluid; and
a second array of conduits extending form the second header and terminating as holes in the outer surface of the body, the second array of conduits adapted to eject the second fluid;

the body comprising a longitudinal center plane;

the first array of conduits located on one side of the longitudinal center plane and the second array of conduits located on the other side of the longitudinal center plane; and wherein the conduits of the first and second arrays are positioned and oriented to eject fluid into contact with the surface of the substrate at locations intersected by the longitudinal center plane of the body.

* * * * *